US006899161B2

(12) United States Patent
Ren et al.

(10) Patent No.: US 6,899,161 B2
(45) Date of Patent: May 31, 2005

(54) METHOD FOR HEAT ABSORPTION USING POLYOXYMETHYLENE POLYMER COMPOSITIONS

(75) Inventors: Jane Ren, Morris Plains, NJ (US); Christopher E. Osuch, Mine Hill, NJ (US); Richard A. Olzak, Kirkland, WA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/408,051

(22) Filed: Apr. 3, 2003

(65) Prior Publication Data

US 2004/0031947 A1 Feb. 19, 2004
US 2005/0006621 A1 Feb. 19, 2004

Related U.S. Application Data

(63) Continuation of application No. 09/329,005, filed on Jun. 9, 1999, now abandoned, and a division of application No. 08/963,948, filed on Nov. 4, 1997, now Pat. No. 6,365,244.

(51) Int. Cl.[7] .............................................. F28D 19/00
(52) U.S. Cl. .................... 165/10; 165/104.17; 428/35.7
(58) Field of Search ...................... 165/104.21, 104.24, 165/10, 104.27, 905, 104.17, 185; 361/700, 704, 705, 708; 257/715; 174/16.3, 50, 52.1, 52.2; 428/36.1, 35.2, 35.7; 206/521, 524.1, 524.3, 524.4, 701, 722; 220/88.1

(56) References Cited

U.S. PATENT DOCUMENTS

| | | | | |
|---|---|---|---|---|
| 4,253,518 A | * | 3/1981 | Minesi | 165/104.27 |
| 4,600,449 A | * | 7/1986 | White et al. | 148/407 |
| 4,944,401 A | * | 7/1990 | Groenewegen | 206/521 |
| 5,438,162 A | * | 8/1995 | Thompson et al. | 174/52.2 |
| 5,965,639 A | * | 10/1999 | Yamauchi et al. | 524/80 |
| 6,040,526 A | * | 3/2000 | Olzak | 174/52.1 |
| 6,365,244 B1 | * | 4/2002 | Ren et al. | 428/35.7 |

FOREIGN PATENT DOCUMENTS

| | | | | |
|---|---|---|---|---|
| GB | 1301296 A | * | 12/1972 | C06D/5/00 |
| SU | 1726490 A1 | * | 4/1992 | C09K/5/06 |

* cited by examiner

*Primary Examiner*—Tho Duong
(74) *Attorney, Agent, or Firm*—Charles J. Rupnick

(57) ABSTRACT

The present invention provides methods for heat absorption and thermally protected enclosures for containing heat sensitive devices, which include a heat absorption composition including polyoxymethylene polymer.

7 Claims, 2 Drawing Sheets

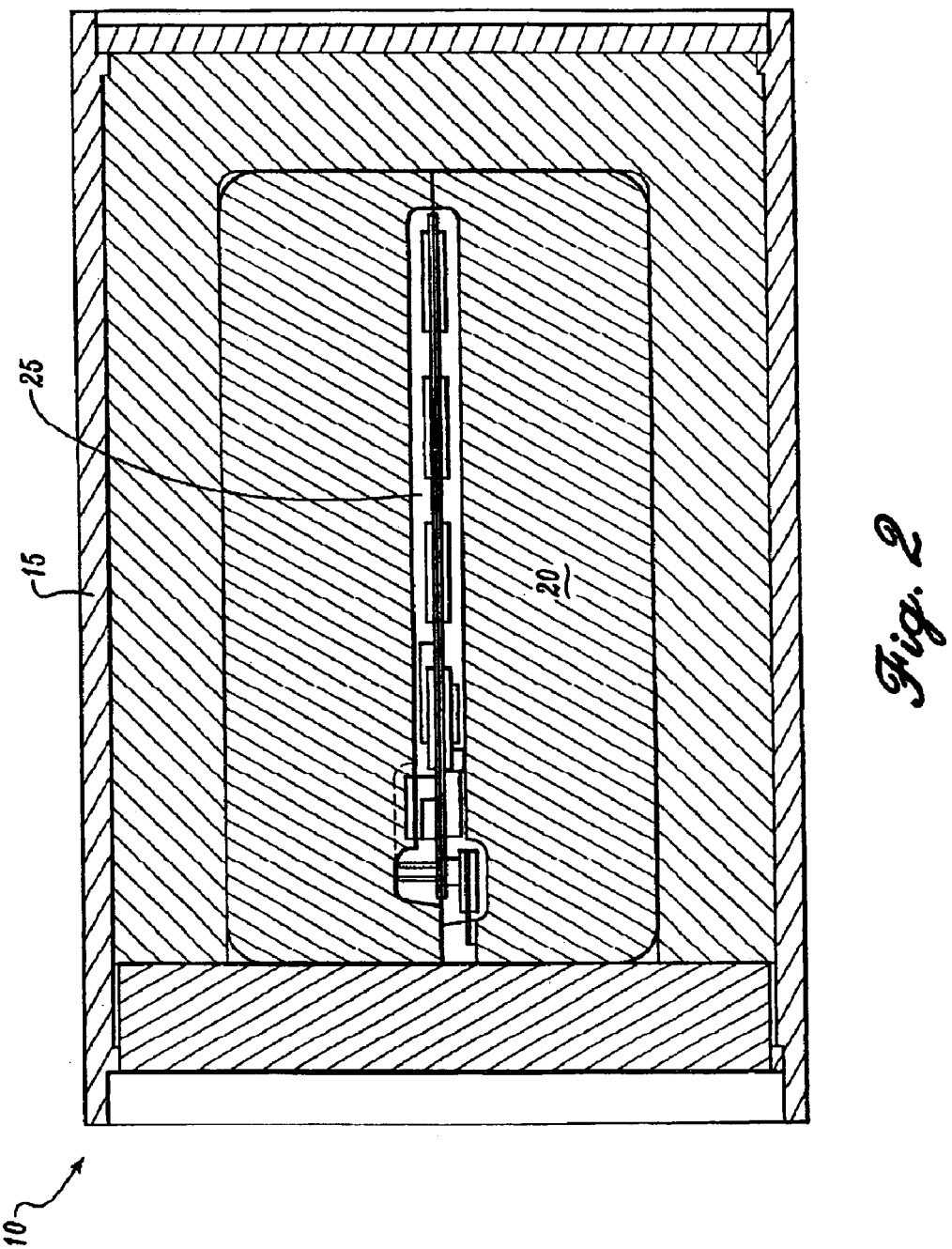

METHOD FOR HEAT ABSORPTION USING POLYOXYMETHYLENE POLYMER COMPOSITIONS

This application is a Continuation and claims the benefit of application Ser. No. 09/329,005 now abandoned which was filed on Jun. 9, 1999 in the names of the inventors of the present application and is a Divisional of application Ser. No. 08/963,948, now U.S. Pat. No. 6,365,244, which was filed on Nov. 4, 1997 in the names of the inventors of the present application.

BACKGROUND OF THE INVENTION

The present invention relates generally to methods and compositions useful for heat absorption, particularly in crash survivable protective enclosures for flight recorders used in aircraft and other vehicles operating over land and water. More particularly, the present invention relates to heat absorption compositions for use in a crash survivable enclosure which is capable of withstanding high impact, shock and mechanical penetration forces that commonly occur in a crash and the high temperatures, flames, and heat that often develop after a crash. The enclosure is designed to resist damage to solid state memory devices contained therein, even if the enclosure is subjected to immersion in fresh water or salt water for a prolonged period.

SUMMARY OF THE INVENTION

As a first aspect, the present invention provides a method for dissipating heat away from a heat sensitive device exposed to a high temperature environment. The method comprises surrounding the heat sensitive device with a composition comprising a polyoxymethylene (POM) polymer and optionally also a binder. The polyoxymethylene polymer exists in a solid state at normal temperatures that undergoes endothermic decomposition when exposed to the high temperature environment, but remains in a solid state during endothermic decomposition. The composition absorbs heat from the high temperature environment during the endothermic decomposition of the polyoxymethylene polymer and dissipates heat away from the heat sensitive device.

As a second aspect, the present invention provides an enclosure for thermally protecting one or more heat sensitive devices from a high temperature environment. The enclosure includes: a) an outer housing having interior surfaces defining an interior cavity for containing one or more heat sensitive devices; and b) a heat absorption composition comprising a solid polyoxymethylene polymer that remains in a solid state while undergoing endothermic decomposition. The composition occupies at least a portion of the interior cavity and substantially surrounds the heat sensitive devices. The polymer exhibits endothermic decomposition when the enclosure is subjected to the high temperature environment, and the composition absorbs heat from the high temperature environment during the endothermic decomposition of the polymer.

These and other aspects of the present invention are described further in the detailed description of the preferred embodiments of the invention which follow.

BRIEF DESCRIPTION OF THE DRAWINGS

FIG. 2 is a cross-section of a thermally protected enclosure according to the present invention.

DESCRIPTION OF THE PREFERRED EMBODIMENT

Figure 1:
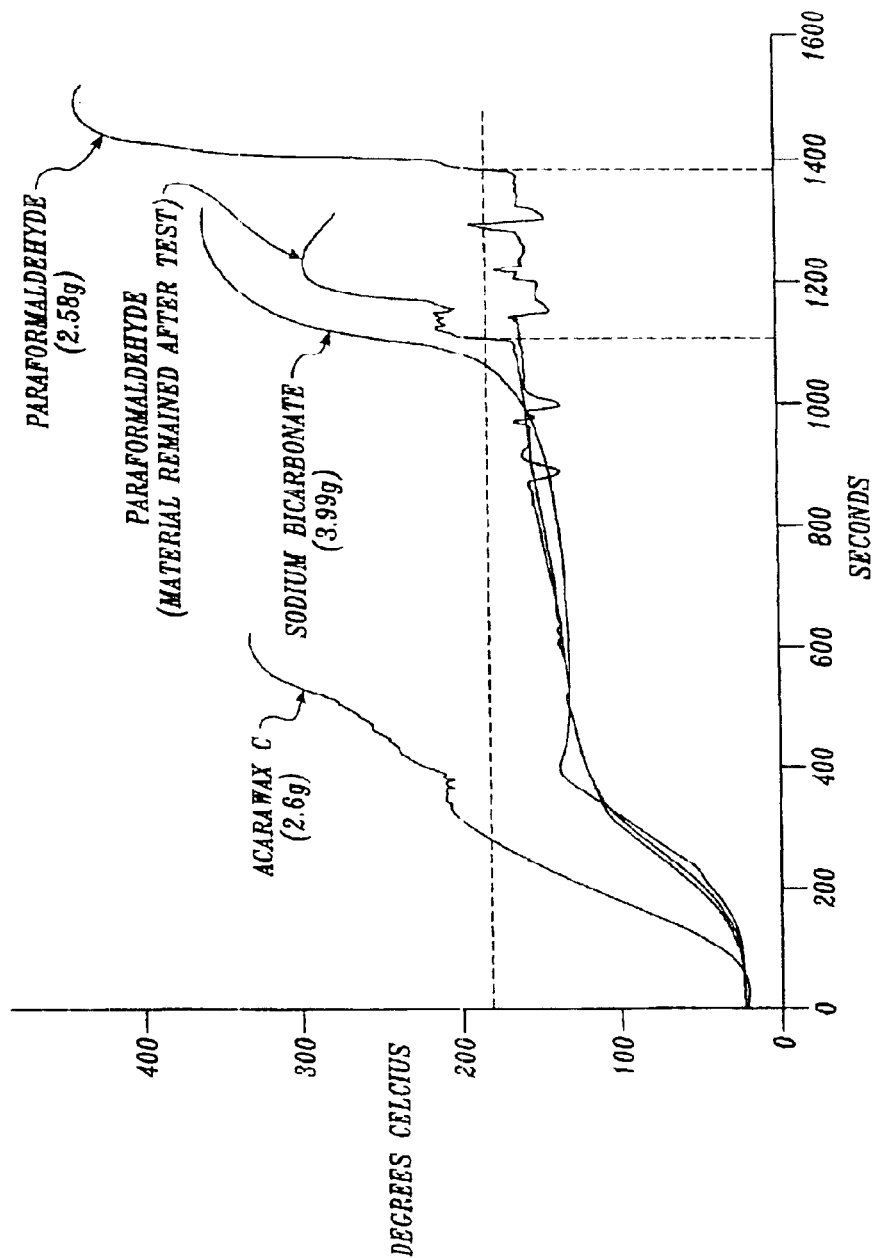
FIG. 1 is a graphical representation of the time versus temperature curve for the polyoxymethylene polymer compositions of the present invention as well as conventional heat absorption compositions employed in thermally protected enclosures such as flight data recorders.

As used herein, all terms have their ordinary meaning in the art unless otherwise indicated. All percentages are percent by weight unless otherwise indicated.

The methods of the present invention involve the use of certain polymer compositions which are characterized in that they absorb heat from a high temperature environment and thereby dissipate heat away from heat sensitive devices which are exposed to the high temperature, environment. Such compositions are particularly useful in thermally protected enclosures such as flight data recorders. The compositions of the present invention are designed to possess greater heat absorption, and thus heat dissipating, characteristics than conventional heat absorption compositions which are currently employed in flight data recorders to absorb and dissipate heat away from heat sensitive devices. The heat absorption characteristics of the composition are useful for providing thermal insulation to heat sensitive devices within the enclosure in a fire or other high temperature environment. In accordance with the present invention, the composition absorbs heat from the high temperature environment during endothermic decomposition of a polyoxymethylene (POM) polymer having the novel characteristic of being a solid that undergoes endothermic decomposition at a temperature below the melting temperature of the material. The polymer thereby undergoes endothermic decomposition while remaining in a solid state. The absorption of heat from the high temperature environment effectively dissipates the heat away from the heat sensitive devices by controlling the temperature rise within the interior compartment of the flight data recorder. As a result, the temperature to which the heat sensitive devices are exposed does not rise to a level at which the heat sensitive devices will be damaged even though the temperature to which the flight data recorder is exposed is significantly higher than the temperature at which damage to the heat sensitive device will occur.

The temperature at which the endothermic decomposition occurs is selected to be: (a) above the peak temperature encountered under normal operating conditions; (b) at or below the peak temperature objective for the heat sensitive devices within the enclosure which are desirously protected from the high temperature environment; and (c) below the melting temperature of the POM polymer. Accordingly, the temperature at which the endothermic decomposition occurs at about 140 degrees C. Furthermore, the melting temperature of the POM polymer composition exceeds 172 degrees C. The melting temperature thus exceeds the decomposition temperature by at least 32 degrees C., so that decomposition occurs before melting. Therefore, each of the POM compositions employed in the methods and enclosures of the present invention absorb heat from the high temperature environment during the endothermic decomposition of the POM polymer while remaining in a solid state and thereby dissipate heat away from the heat sensitive device.

The POM compositions employed in the methods and enclosures of the present invention include a polyoxymethylene polymer having the general formula:

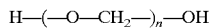

where n is a number from 8 to 100 inclusive.

POM polymers having the forgoing general formula are generally well-known and commercially available in the art and are also known as "paraformaldehyde," and several versions of the polymer having the foregoing structural formula are commercially available under the trade name DELRIN© from E.I. du Pont de Nemours and Company, as are other suitable POM polymer materials from other sources. Those skilled in the polymer art may readily identify other suitable commercially available polymers having the foregoing general formula by reference to any of several chemical reagent supplier catalogues.

Certain commercially available polyoxymethylene polymers may be stabilized to prevent unzipping. Catalytic stabilization of POM compositions is well known to those of ordinary skill in the art. Such stabilization increases the decomposition temperature to about 300 degrees C. The melting temperature remains in the range of about 172–180 degrees C. When the melting point and decomposition temperatures differ significantly composition melts before it decomposes. Accordingly, when such polymers are employed in the methods and compositions of the present invention, it may be desirable to include, in the composition, an acid catalyst capable of initiating the degradation or unzipping of the stabilized polyoxymethylene polymer. Acid catalysts are used to initiate and control unzipping so that the composition first decomposes and then melts, the control of unzipping is thus used in the invention to control a heat transfer rate.

The required decomposition rate, which is a function of the heat flow rate into the interior of the enclosure, will determine whether a catalyst is needed. In addition, the heat-flow rate will also determine how the catalyst should be included in the composition. If only a little catalytic activity is required, the catalyst may be applied as a dry power to the surface of the heat absorbing composition. If greater catalytic activity-is required, it may be beneficial to disperse the acid catalyst throughout the polymer composition. Suitable acid catalysts which may be employed to catalyze the decomposition of the polyoxymethylene polymer in the high temperature environment include, catalysts which generate acids upon exposure to heat. Specific examples of acid catalysts include benzoic acid, diphenyliodonium triflate and triphenylsulfonium triflate. Typically, the acid catalyst is provided in an amount of from about 0 to about 5 percent by weight of the composition.

If desired, the heat absorption compositions of the present invention may include a binder, although a binder is not necessary. The polymers employed in the present invention are typically in the form of a powder, flake or other particulate form, which can be molded extruded, or machined into a complex shape. However, a binder may be admixed with the particulate polymer to assist in holding the polymeric particles together during the molding process. For example it is often desirable for compositions for use in thermally protected enclosures to be molded into the general configuration of the interior cavity of the enclosure or smaller geometrically shaped units such as blocks and cubes. The binder holds the aggregated powder in the desired configuration. As a further advantage, the binder also provides shock absorption properties to the composition.

The binder is typically a wax binder. Examples of suitable wax binders include but are not limited to polyethylene wax, polypropylene wax, oxidized polyethylene, copolymers of ethylene and comonomer, and copolymers of propylene and comonomer. Suitable comonomers include those monomers which are copolymerizable with ethylene or propylene, such as linear, branched, or cyclic alkene monomers including butene, hexene, pentene, octene, and higher homologs; acrylic acid; and vinyl acetate. These binders, including the copolymers, are commercially available. Preferred binders include oxidized polyethylene wax, paraffin wax, and poly (ethylene-vinyl acetate) oxidized polyethylene wax is currently the most preferred binder for use in the compositions of the present invention.

Typically, the composition includes a) between about 90 percent and about 100 percent by weight inclusive of the polyoxymethylene polymer; and b) between about 10 percent and about 0 percent by weight of the binder. More preferably the composition comprises about 95 percent by weight of a polymer and about 5 percent by weight of a binder. One preferred composition includes about 99 percent by weight of the polymer and about 1 percent by weight of the binder. The physical characteristics of a combination of POM polymer, acid and a binder, in the proportions described in the invention, are well known to those of ordinary skill in the art. Such combinations are found in a solid form at room temperature.

In another preferred embodiment, the composition does not include binder, and includes 100 percent by weight of the polyoxymethylene polymer.

In those embodiments-wherein a binder is included in the composition, the composition may be prepared by manually combining the polymer and binder in a manner that provides a relatively uniform composition. The composition may be prepared by manually combining the two components in a manner that provides a relatively uniform composition. The composition may be preparedtby mechanically mixing, stirring or otherwise combining the components so as to provide a blend of uniform consistency. For example, the composition may be prepared by blending the binder into the particulate polymer component. Once a composition of uniform consistency is achieved, the composition may be molded into any suitable shape by using relatively low pressure. The blocks which are often desirable for use in flight data recorders may be prepared using compression molding techniques. For example blocks may be prepared by grinding the wax binder below room temperature into a fine powder, mixing the powdered wax binder with the polymer at a temperature of from between about 50 and about 95 at a pressure between about 5,625 psi and about 22,500 psi. Typically, the higher temperatures and pressures are preferred in the compression molding of the compositions of the present invention.

In a fire or other high temperature environment, the compositions of the present invention act as a heat shield initially, by exhibiting thermal inertia. When the composition reaches the reactivity temperature, i.e., the temperature at which decomposition of the polymer begins, the composition acts as a heat sink by utilizing the heat energy of the high temperature environment to initiate and maintain the endothermic decomposition reaction of the polymer. The reactivity temperature at which decomposition of the composition-begins is about 140 degrees C. In contrast, the melting temperature of the POM polymer of the invention as described herein is at least 172 degrees C. The reactivity temperature is thus adjusted to be much lower than the melting temperature so that the polymer decomposes directly from its solid state into its gaseous components, without passing through an intermediate liquid state.

Once the compositions of the present invention reach the reactivity temperature, the endothermic decomposition reaction begins. At temperatures equal to or greater than the reactivity temperature, the polyoxymethylene polymer undergoes a polymer "unzipping" reaction as follows.

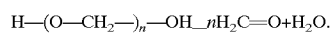

In other words, the polymer decomposes back to its original monomers, namely formaldehyde, without passing through an intermediate liquid state. The polymer unzipping proceeds by an endothermic reaction mechanism. The term "endothermic" is well defined in the art and refers to reactions which require the input of heat energy to maintain the reacting mass at a constant temperature. Thus, the heat absorption composition absorbs heat from the high temperature environment to initiate and drive the endothermic decomposition of the polyoxymethylene polymer. The use of the heat energy to initiate and drive this endothermic reaction has the effect of maintaining the maximum temperature environment within the enclosure at an acceptable level which does not cause significant heat damage to the heat sensitive devices within the enclosure.

The formaldehyde product which results from the endothermic decomposition reaction is flammable. The amount of formaldehyde gas released from the composition is often significant. Without venting, the pressure could rise excessively and the heat dissipation properties would also be lower. To avoid the potential pressure damage to the heat sensitive devices within the enclosure as the pressure from the formaldehyde gas increases, a vent is provided in the enclosure to allow the escape of the generated formaldehyde gas.

The expected gas evolution rate can be predicted from the heat flow anticipated in the final design. The heat flow can be estimated from the wall type and thickness, the insulation type and thickness (or thermal conduction coefficient) and the approximate physical size of the unit. Given the heat flow, the temperature profile and gas evolution rates can be estimated from each materials known thermochemical behavior.

FIG. 1 is a graphical representation of the time versus temperature characteristics of the compositions of the present invention as compared to sodium bicarbonate, another new heat absorption composition, which is described in copending application Ser. No. 09/052,913, filed concurrently herewith. As can be seen from the graph, the polyoxymethylene polymer compositions of the present invention absorb more heat than the sodium bicarbonate compositions, which in turn are more efficient than conventional heat absorption compositions. The time required for the polyoxymethylene polymer composition to reach a given temperature in a high temperature environment is as long or longer than the time required for the bicarbonate composition to reach the same temperature. This result demonstrates that the polyoxymethylene polymer compositions are as effective or more effective than the sodium bicarbonate at absorbing heat from the high temperature environment.

A POM polymer composition of the invention begins to decompose directly into its gaseous components when exposed to a thermal environment as shown in FIG. 1. The temperature at which endothermic decomposition begins is about 140 degrees C. The compositions of the present invention thus have an added advantage over conventional silica compositions in that they will not loose water in an unconfined space because the compositions of the present invention do not melt before endothermic decomposition reaction of the polymer is complete. The compositions of the present invention thus normally exist in a solid state and remain in a solid state during endothermic decomposition. An additional advantage over hydrated silica composition is ease of formability and subsequent handling during the manufacturing process.

The improved heat absorption properties observed with the polyoxymethylene polymer compositions of the present invention as compared to conventional heat absorption compositions is a very important advantage in applications such as flight data recorders. In the event of a crash, the flight data recorder may be subjected to temperatures in the range of 1,100 degrees C. for up to an hour. Thus it is clearly advantageous to use a heat absorption composition which absorbs more heat energy and thereby provides greater protection to the heat sensitive devices contained therein.

In addition to the foregoing, the compositions of the present invention provide a number of advantages. The components of the composition are relatively easy to handle, relatively low in cost, formable, and more effective at heat absorption as compared to conventional heat absorption materials. Also, because the compositions of the present invention absorb heat more efficiently than conventional heat absorption agents, flight data recorders including the compositions of the present invention may be smaller than conventional flight data recorders without sacrificing heat absorption protection for the heat sensitive devices contained therein.

The compositions of the present invention are particularly useful in enclosures for thermally protecting one or more heat sensitive devices from a high temperature environment, such as aircraft flight data recorders which include heat sensitive devices for recording and storing data. Flight data recorders are known in the art and are configured to provide a record of various important aircraft performance parameters over a predetermined time interval. Flight data recorders record performance parameters continuously from the time the electrical system of the aircraft is activated. Because they have a limited memory they can only hold information relating to such parameters for the predetermined time interval. Hence, as new data is continuously collected, it is continuously written over old data. In the event that the flight data recorder is deactivated, which occurs if the aircraft crashes, the flight data recorder will retain in memory the performance parameters recorded over the predetermined time interval immediately prior to deactivation. In operation, the information stored within a memory unit is continually supplied by additional components of the flight data recorder system such as a data acquisition unit that receives input signals from various aircraft sensors and systems, and processes those signals to produce signals compatible with the recording or storage medium employed by the flight data recorder memory unit.

The compositions of the present invention may be employed in any conventional thermally protected flight data recorder, including but not limited to the flight data recorders described in U.S. Pat. Nos. 4,694,119 and 4,944,401 both to Gruenwegan, U.S. Pat. No. 4,600,449 to White et al., and U.S. Pat. No. 5,438,162 to Thompson et al., the disclosures of which are hereby incorporated by reference in their entirety. Generally, the thermally protected flight data recorders are one type of thermally protected enclosures which include an outer housing, the heat sensitive devices for recording data, and the heat absorption (i.e., thermal protecting) composition of the present invention.

Referring to FIG. 2, the outer housing 15 of the enclosure 10 is typically constructed of a metal that exhibits a high thermal conductivity and high resistance to crushing and piercing. An intumescent coating or paint is generally applied to the exterior surfaces of the outer housing 15 for additional thermal insulation. The enclosure 10 may be provided in any suitable shape, and is typically substantially rectangular in cross-section when viewed perpendicular to each-of its major axes. An insulating layer of solid material that exhibits a relatively low thermal conductivity adjoins each interior surface of the outer housing 15 to form a rectangular interior cavity that is centrally located within the outer housing 15. As noted above, the housing 15 may be designed to permit the escape of gaseous carbon dioxide which is produced in the endothermic decomposition of the bicarbonate compound.

The one or-more heat sensitive devices 25 employed in the enclosure 10 are located within and contained by the interior cavity of the housing 15. In a preferred embodiment of the invention, the heat sensitive devices 25 are solid state electronic memory devices for storing data which is to be recovered from each of the solid state electronic memory devices following exposure of the enclosure 10 to a high temperature environment. Examples of such devices include semiconductor electronically erasable programmable read-only memory circuits. A data acquisition unit periodically supplies digital signals which are sequentially written into the semiconductor memory circuits so that the memory circuits store a sequence of digital words that is a time sampled data representation of the history for each parameter being monitored. Typically, with respect to currently employed techniques, data compression is generally employed to allow storing digital signals representative of a: 15–30 minute time history for each monitored parameter.

To provide the heat shielding necessary to protect these heat sensitive devices 25 from a high temperature environment to which the enclosure 10 is subjected, the composition 20 of the present invention is provided in the open spaces of the interior cavity of the housing 15, substantially surrounding the heat sensitive devices 25. The composition 20 occupies at least a portion of the interior cavity. The compositions 20 of the present invention are formable under low pressure and at temperatures below the melting point of either component, as discussed above. Accordingly, the composition 20 may be molded to both conform to the shape of the interior cavity and to surround the heat sensitive devices therein.

The compositions of the present invention do not combust within the enclosure because the small amount of oxygen within the enclosure will be rapidly depleted or expelled. The compositions of the present invention also absorb radiant heat from any residual insulation and from the interior surfaces of the enclosure. This heat is subsequently carried outside the container and disposed of in the flame front rather than building up inside the small cavity containing the heat sensitive devices. Furthermore, because the POM composition does not melt into liquid form before or during endothermic decomposition, the protective shell shape is retained until decomposition is complete.

Polyoxymethylene (POM) polymers as disclosed herein are well-known and commercially available, for example, under the trade name DELRIN© manufactured by du Pont de Nemours and Company. The chemical and physical characteristics of these POM polymers are readily known to one of ordinary skill in the art.

Additionally, the following characteristics of the POM composition as described herein were known to one of ordinary skill in the art on or before the filing date of the present application.

Catalytic stabilization of POM polymer compositions is well-known to those of ordinary skill in the art. Such stabilization increases the decomposition temperature to about 300 degrees C. It is also well-known in the art that the presence of acids, such as benzoic acid, reduces the decomposition temperature of POM compositions. In addition, the physical characteristics of a combination of POM polymer, acid and a binder, in the proportions described herein, are well known to those of ordinary skill in the art. Such combinations are found in a solid form at room temperature.

Furthermore, a POM composition such as that as described herein begins to decompose directly into its gaseous components, without passing through an intermediate liquid state, when exposed to a thermal environment as shown in FIG. 1. It is known that the temperature at which endothermic decomposition begins is about 140 degrees C. and that the POM composition as described herein has melting temperature exceeding 172 degrees C.

It is also known that a POM composition as described herein, when exposed to a thermal environment as shown in FIG. 1, retains its physical form as a solid mass until heated to its reaction temperature of endothermic decomposition at about 140 degrees C. At its reaction temperature of endothermic decomposition, the POM composition begins to decompose directly into its gaseous components without an intermediate state change from solid to liquid.

In addition to their utility as heat absorbing materials, the compositions of the present invention, particularly in those embodiments including a binder, are also useful in enclosures such as flight data recorders as shock absorbing materials. For example, the enclosure may be subjected to intense shock in the area of 3,400 Gs on impact during crash conditions. Under such physical impact force, the compositions of the present invention absorb a portion of the shock by deforming enough to divert the impact shock wave away from the memory device, but not enough to penetrate any surrounding insulation creating voids that might become heat flux paths to the heat sensitive devices.

Although the essential elements of the enclosure include only the housing, the heat sensitive devices, and the composition of the present invention, one skilled in the art will understand that a number of modifications to the enclosure are possible which are based upon conventional technology in the art of flight data recorders, and are therefore contemplated by the instant invention. For example, it may be desirable to include as another element of the enclosure, a thermal insulating layer between the compositions of the present invention and the interior surfaces of the interior cavity. Suitable thermal insulating liners will be readily determinable by those skilled in the art and include a shell-like thermal liner positioned within the interior cavity adjacent to the interior surfaces of the interior cavity, which conforms to the geometric shape of the interior cavity. Preferably, the thermal liner is a unitary structure formed of a solid material that is a good thermal insulator (i.e., has a low thermal conductivity, K) and relatively low density. Examples of such materials include but are not limited to thermal insulators solid under the trade names MIN-K 20000, from Johns-Manville Co., of Denver Colo., and MICROTHERM©, from Upton-Wirral Merseyside, England.

The foregoing is illustrative of the present invention and is not to be construed as limited therefore. The invention is defined by the following claims, with equivalents of the claims to be included therein.

That which is claimed is:

1. A method for dissipating heat away from a heat sensitive device exposed to a high temperature environment, the method comprising: surrounding the heat sensitive device with a solid heat absorption composition comprising polyoxymethylene polymerand and a catalyst, wherein the polyoxymethylene polymer undergoes endothermic decomposition directly from solid to gas when exposed to the high temperature environment, wherein said catalyst establishes an initiation temperature of said endothermic descomposition and wherein said composition absorbs heat from the high temperature environment during the endothermic decomposition of the polyoxymethylene polymer while remaining in a solid state and thereby dissipates heat away from the heat sensitive device.

2. The method of claim 1, wherein said catalyst is selected from the group consisting of benzoic acid, diphenyliodonium triflate and triphenylsulfonium triflate.

3. The method of claim 1, wherein said heat absorption composition further comprises a binder.

4. The method of claim 1, wherein said catalyst is applied to the surface of the heat absorption composition.

5. The method of claim 4, wherein said catalyst is applied as a dry power to the surface of the heat absorption composition.

6. The method of claim 1, wherein said catalyst is dispersed throughout the heat absorption composition.

7. The method of claim 1, wherein said catalyst further comprises a catalyst that generates acid upon exposure to heat.

* * * * *